(12) United States Patent
Komatsu et al.

(10) Patent No.: US 9,463,542 B2
(45) Date of Patent: Oct. 11, 2016

(54) HOLDING TABLE

(71) Applicant: Disco Corporation, Tokyo (JP)

(72) Inventors: Atsushi Komatsu, Tokyo (JP); Takeshi Kitaura, Tokyo (JP); Masamichi Kataoka, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 452 days.

(21) Appl. No.: 13/887,501

(22) Filed: May 6, 2013

(65) Prior Publication Data

US 2013/0300045 A1 Nov. 14, 2013

(30) Foreign Application Priority Data

May 10, 2012 (JP) .................................. 2012-108397

(51) Int. Cl.

| | |
|---|---|
| *H01L 21/304* | (2006.01) |
| *B23Q 3/08* | (2006.01) |
| *H01L 21/67* | (2006.01) |
| *H01L 21/683* | (2006.01) |
| *B23Q 1/38* | (2006.01) |

(52) U.S. Cl.
CPC ......... *B23Q 3/088* (2013.01); *H01L 21/67092* (2013.01); *H01L 21/6838* (2013.01); *B23Q 1/38* (2013.01); *H01L 21/304* (2013.01)

(58) Field of Classification Search
CPC .................... H01L 21/6838; H01L 21/67092; H01L 21/304; H01L 21/6834; B23Q 3/088; B23Q 1/38; B23B 31/307
USPC ........................................ 261/21; 269/21, 20
See application file for complete search history.

(56) References Cited

U.S. PATENT DOCUMENTS

| | | | | |
|---|---|---|---|---|
| 3,253,665 | A * | 5/1966 | Schienle ........................ | 180/164 |
| 3,597,081 | A * | 8/1971 | Cason et al. .................... | 355/91 |
| 4,559,718 | A * | 12/1985 | Tadokoro .................. | F26B 5/08 118/52 |
| 5,374,829 | A * | 12/1994 | Sakamoto ............... | C30B 25/12 250/453.11 |
| 5,513,668 | A * | 5/1996 | Sumnitsch .................... | 134/157 |
| 6,022,417 | A * | 2/2000 | Sumnitsch .......... | H01L 21/6838 118/728 |
| 6,173,648 | B1 * | 1/2001 | Misono ................. | B25B 11/005 101/474 |
| 6,245,678 | B1 * | 6/2001 | Yamamoto ........ | H01L 21/02021 216/92 |
| 6,328,846 | B1 * | 12/2001 | Langen ............. | H01L 21/67069 118/728 |

(Continued)

FOREIGN PATENT DOCUMENTS

| | | |
|---|---|---|
| JP | 05-021763 | 1/1993 |
| JP | 09-066429 | 3/1997 |

(Continued)

*Primary Examiner* — Joseph J Hail
*Assistant Examiner* — Arman Milanian
(74) *Attorney, Agent, or Firm* — Greer Burns & Crain, Ltd.

(57) ABSTRACT

A holding table for holding a platelike workpiece which includes a base and an annular holding member attached to the base. The annular holding member has an annular holding surface for holding the outer circumferential portion of the platelike workpiece thereon. Accordingly, a central recess is defined by the base and the annular holding member so as to be surrounded by the annular holding member. The annular holding member is formed with a suction opening exposed to the annular holding surface, a vacuum line having one end communicating with the suction opening and the other end connected to a vacuum source, a discharge opening exposed to the annular holding surface at a position radially outside of the suction opening, and a fluid line having one end communicating with the discharge opening and the other end connected to a fluid source.

2 Claims, 4 Drawing Sheets

(56) References Cited

U.S. PATENT DOCUMENTS

| | | | |
|---|---|---|---|
| 6,466,046 B1* | 10/2002 | Maruyama et al. | 324/754.15 |
| 7,055,535 B2* | 6/2006 | Kunisawa | H01L 21/6838 134/157 |
| 2002/0067585 A1* | 6/2002 | Fujiwara | B23Q 3/154 361/234 |
| 2005/0202678 A1* | 9/2005 | Abrams | H01L 21/304 438/692 |
| 2008/0146124 A1* | 6/2008 | Morita | B23B 31/307 451/289 |
| 2009/0060688 A1* | 3/2009 | Asada | 414/217 |
| 2015/0214090 A1* | 7/2015 | Jin | H01L 21/6838 269/13 |

FOREIGN PATENT DOCUMENTS

| | | |
|---|---|---|
| JP | 2004-107606 | 4/2004 |
| JP | 2010-109249 | 5/2010 |
| WO | 2011/077911 | 6/2011 |

\* cited by examiner

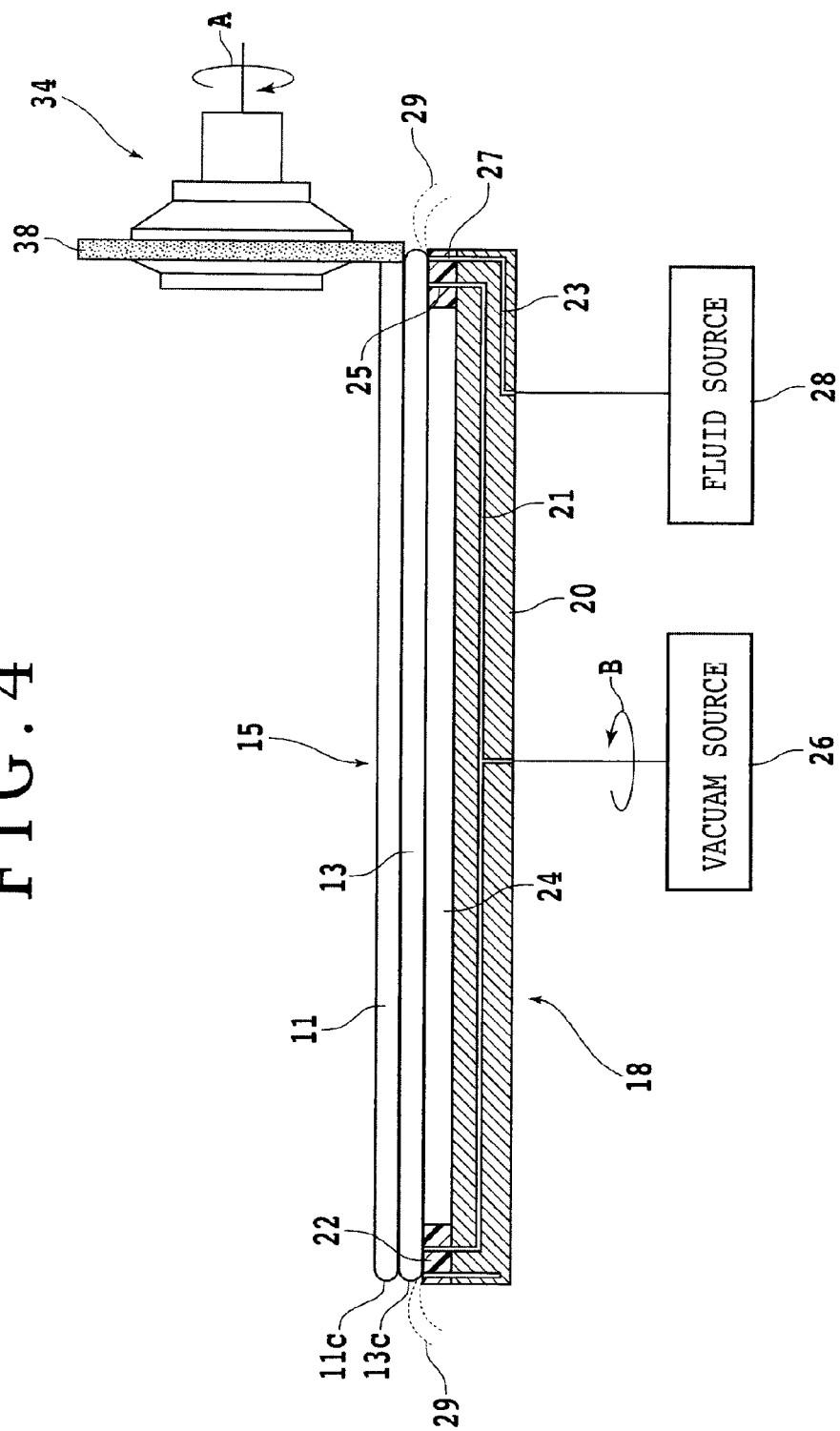

HOLDING TABLE

BACKGROUND OF THE INVENTION

1. Field of the Invention

The present invention relates to a holding table for holding a platelike workpiece such as a wafer.

2. Description of the Related Art

A processing apparatus such as a grinding apparatus, cutting apparatus, and laser processing apparatus for processing a platelike workpiece such as a wafer includes a holding table (chuck table) having a holding surface for holding the platelike workpiece under suction as disclosed in Japanese Patent Laid-open No. Hei 5-23941 and Japanese Patent Laid-open No. 2008-140832, for example. In processing the workpiece held on the holding table under suction, there is a possibility that contaminants may adhere to the contact surface of the workpiece which comes into contact with the holding surface of the holding table.

As a result, there is a possibility that the contaminants adhering to the workpiece may contaminate a transporting unit for transporting the workpiece or contaminate the inside of a cassette for storing the workpiece after processing. When a clean workpiece is transported by the transporting unit once contaminated or stored into the cassette once contaminated, there is a possibility that the clean workpiece may also be contaminated. As disclosed in Japanese Patent Laid-open No. 2004-107606, there is a case that a platelike workpiece is attached through an adhesive or wax to a support plate in order to facilitate the handling of the workpiece. Further, as disclosed in Japanese Patent Laid-open No. 5-21763, there is widely used a technique of directly bonding a workpiece to a support plate.

SUMMARY OF THE INVENTION

In the case that a stacked workpiece formed by attaching a workpiece to a support plate is held on the holding table under suction in the condition where the support plate comes into contact with the holding surface, the support plate may be flawed. Even when the support plate thus flawed is reused, there is a possibility that the support plate cannot be held under suction on the holding table, depending on the size of flaws. Further, when the workpiece attached to the support plate having flaws is subjected to processing with heat, there is a possibility that the support plate may be broken from the flaws and the workpiece may also be broken. Accordingly, the support plate once used is conventionally discarded. This is very uneconomical and the reuse of the support plate has been desired.

It is therefore an object of the present invention to provide a holding table which can reduce the possibility of adhesion of contaminants to a platelike workpiece held under suction or flawing of the workpiece.

In accordance with an aspect of the present invention, there is provided a holding table for holding a platelike workpiece, including a base; and an annular holding member attached to the base, the annular holding member having an annular holding surface for holding the outer circumferential portion of the platelike workpiece thereon, whereby a central recess is defined by the base and the annular holding member so as to be surrounded by the annular holding member; the annular holding member being formed with a suction opening exposed to the annular holding surface, a vacuum line having one end communicating with the suction opening and the other end connected to a vacuum source, a discharge opening exposed to the annular holding surface at a position radially outside of the suction opening, and a fluid line having one end communicating with the discharge opening and the other end connected to a fluid source. Preferably, the annular holding member is formed of resin.

In the case that the platelike workpiece is a stacked workpiece formed by attaching a platelike workpiece to a support plate, only the outer circumferential portion of the support plate is held under suction on the annular holding member. Accordingly, it is possible to reduce the possibility of flawing of the support plate or adhesion of contaminants to the support plate, so that contamination of the transporting unit or the cassette can be prevented and the support plate can be reused.

The above and other objects, features and advantages of the present invention and the manner of realizing them will become more apparent, and the invention itself will best be understood from a study of the following description and appended claims with reference to the attached drawings showing a preferred embodiment of the invention.

BRIEF DESCRIPTION OF THE DRAWINGS

FIG. 4 is a partially sectional side view in the condition where trimming is being performed on a chamfered portion formed along the outer circumference of a platelike workpiece attached to the support plate.

DETAILED DESCRIPTION OF THE PREFERRED EMBODIMENT

Figure 1:
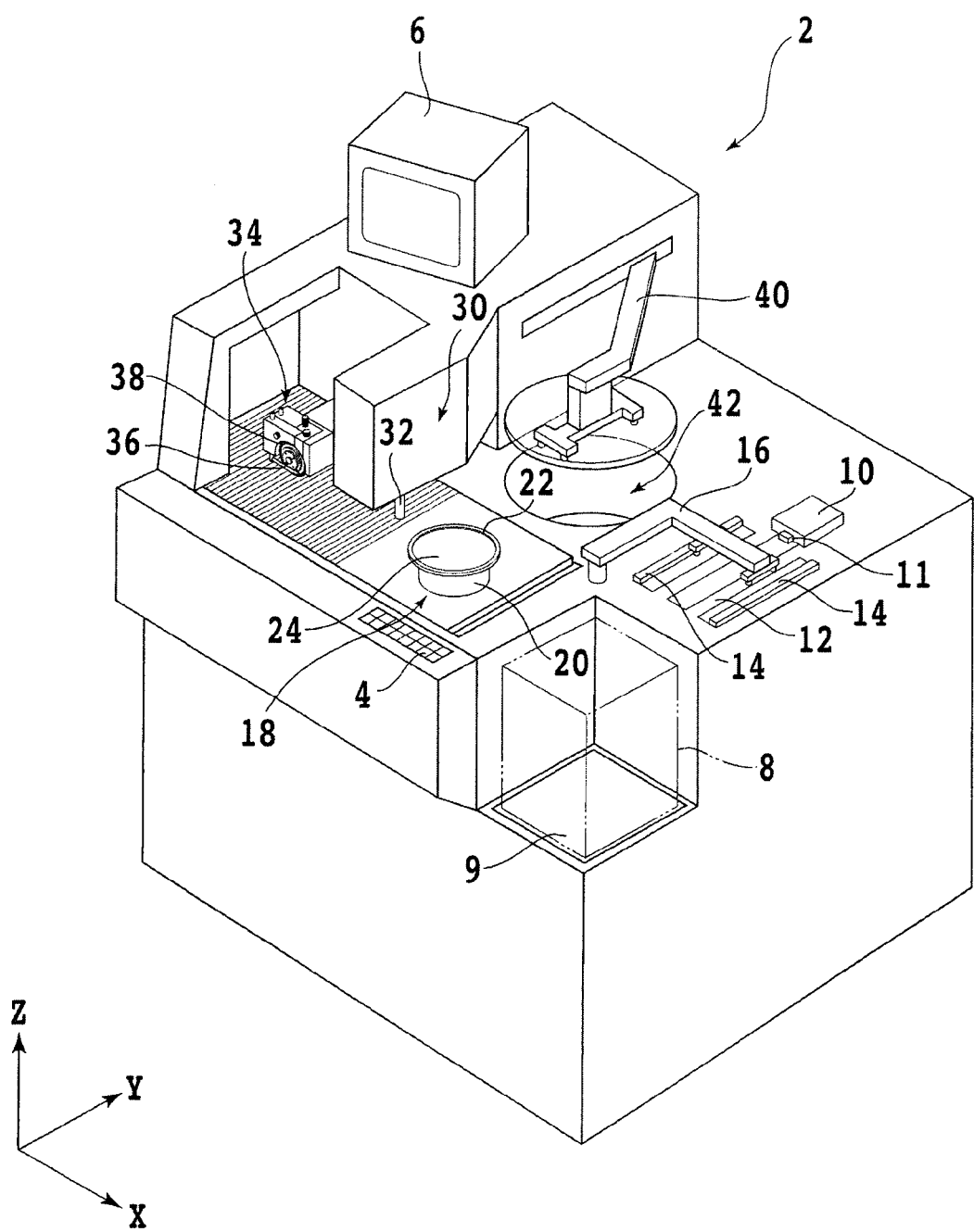
FIG. 1 is a perspective view of a cutting apparatus including a holding table according to a preferred embodiment of the present invention.

A preferred embodiment of the present invention will now be described in detail with reference to the drawings. Referring to FIG. 1, there is shown a perspective view of a cutting apparatus 2 including a holding table (chuck table) 18 according to a preferred embodiment of the present invention. The cutting apparatus 2 includes an operation panel 4 for allowing an operator to input instructions such as processing conditions to the apparatus 2. The operation panel 4 is provided at the front portion of the cutting apparatus 2. The cutting apparatus 2 further includes a display unit 6 such as a CRT for displaying a guide view to the operator or an image obtained by an imaging unit to be hereinafter described. The display unit 6 is provided at the upper portion of the cutting apparatus 2.

A plurality of (e.g., 25) platelike workpieces such as wafers are stored in a cassette 8. The cassette 8 is placed on a vertically movable cassette elevator 9. A handling unit 10 is provided on the rear side of the cassette 8 to take any one of the workpieces out of the cassette 8 before processing and also bring back the workpiece into the cassette 8 after processing. The handling unit 10 has a clamp 11 for gripping the workpiece in handling the workpiece with respect to the cassette 8. The handling unit 10 is linearly movable in the Y direction.

A temporary setting area 12 for temporarily setting the workpiece before cutting or after cutting is formed between the cassette 8 and the handling unit 10. A pair of positioning members 14 for centering the workpiece is provided in the temporary setting area 12. A first transporting unit 16 having a swivel arm is provided in the vicinity of the temporary setting area 12 to transport the workpiece by holding it under suction. The workpiece to be processed is transported from the temporary setting area 12 to the holding table (chuck table) 18 by the first transporting unit 16 under suction. The workpiece thus transported to the holding table 18 is held on the holding table 18 under suction.

The holding table 18 is rotatable and reciprocatable in the X direction. An alignment unit 30 for detecting a subject area of the workpiece to be cut is provided above a path of movement of the holding table 18 along the X direction. The alignment unit 30 includes an imaging unit 32 for imaging the front side of the workpiece. The imaging unit 32 has an imaging device and a microscope. The alignment unit 30 can detect the subject area to be cut by imaging processing such as pattern matching according to an image obtained by the imaging unit 32. The image obtained by the imaging unit 32 is displayed by the display unit 6.

A cutting unit 34 for cutting the workpiece held on the holding table 18 is provided on the left side of the alignment unit 30 as viewed in FIG. 1. The cutting unit 34 is integral with the alignment unit 30, and they are movable together in the Y direction and the Z direction. The cutting unit 34 includes a spindle 36 adapted to be rotationally driven and a cutting blade 38 mounted to the front end of the spindle 36. The cutting unit 34 is movable in the Y direction and the Z direction. The cutting blade 38 is located on an extension line extending from the imaging unit 32 in the X direction. Reference numeral 40 denotes a second transporting unit for transporting the workpiece from the holding table 18 to a spinner cleaning unit 42 after performing a cutting operation by the cutting unit 34. The spinner cleaning unit 42 functions to perform spin cleaning and spin drying to the workpiece.

Figure 2:
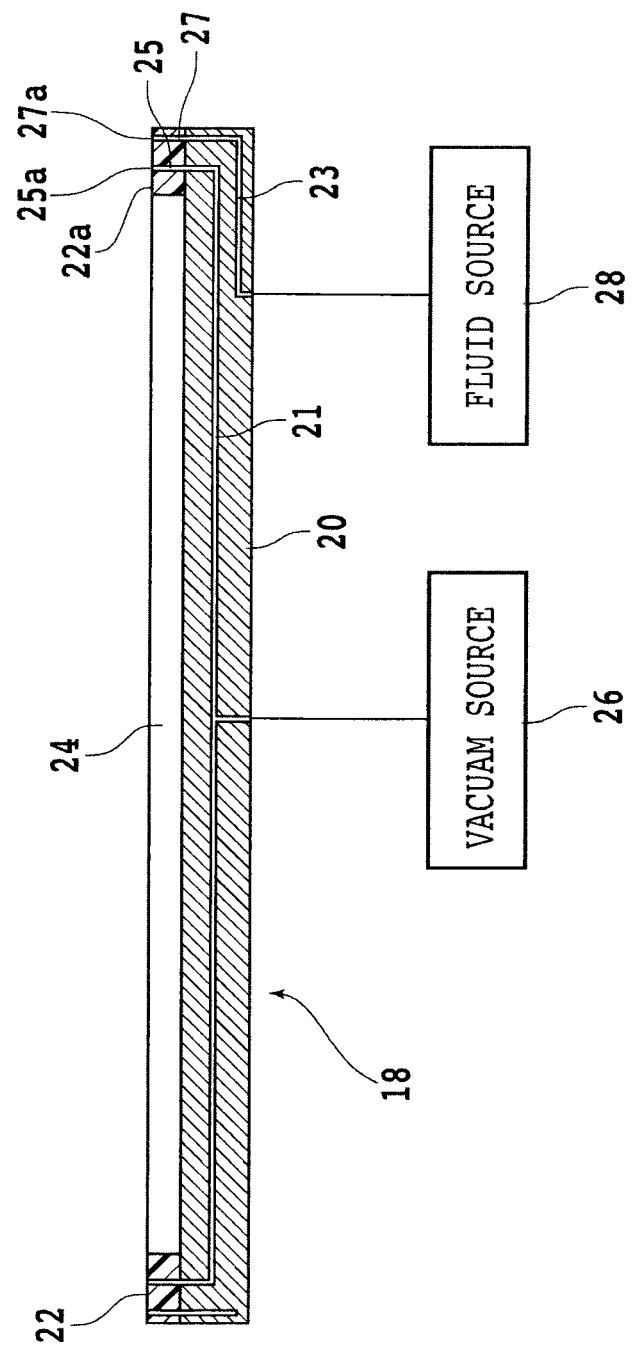
FIG. 2 is a vertical sectional view of the holding table shown in FIG. 1.

Referring to FIG. 2, there is shown a vertical sectional view of the holding table 18 according to this preferred embodiment. The holding table 18 includes a base (frame) 20 formed of metal such as stainless steel and an annular holding member 22 attached to the base 20. The annular holding member 22 has an annular holding surface 22a for holding the outer circumferential portion of the workpiece thereon. Accordingly, the holding table 18 has a central recess 24 defined by the base 20 and the annular holding member 22 so as to be surrounded by the annular holding member 22. Preferably, the annular holding member 22 is formed of a conductive resin, so that it is possible to prevent the adhesion of contaminants to the annular holding member 22 due to static electricity.

The whole of the holding table 18 is not formed of resin, but the base 20 is formed of metal such as SUS and only the annular holding member 22 is formed of resin. Accordingly, the rigidity of the holding table 18 can be maintained. The base 20 is formed with a vacuum line 21 selectively connected through an electromagnetic on-off valve (not shown) to a vacuum source 26. The base 20 is further formed with a fluid line 23 selectively connected through an electromagnetic on-off valve (not shown) to a fluid source 28.

The annular holding member 22 is formed with an annular vacuum line 25 connected to the vacuum line 21 of the base 20 and an annular fluid line 27 connected to the fluid line 23 of the base 20. The annular holding surface 22a of the annular holding member 22 is formed with an annular suction opening 25a communicating with the annular vacuum line 25 and an annular discharge opening 27a communicating with the annular fluid line 27. The annular discharge opening 27a is located radially outside of the annular suction opening 25a. The annular suction opening 25a may be replaced by a plurality of suction openings spaced from each other in the circumferential direction of the annular holding member 22. Further, the annular discharge opening 27a may be replaced by a plurality of discharge openings spaced from each other in the circumferential direction of the annular holding member 22.

Figure 3:
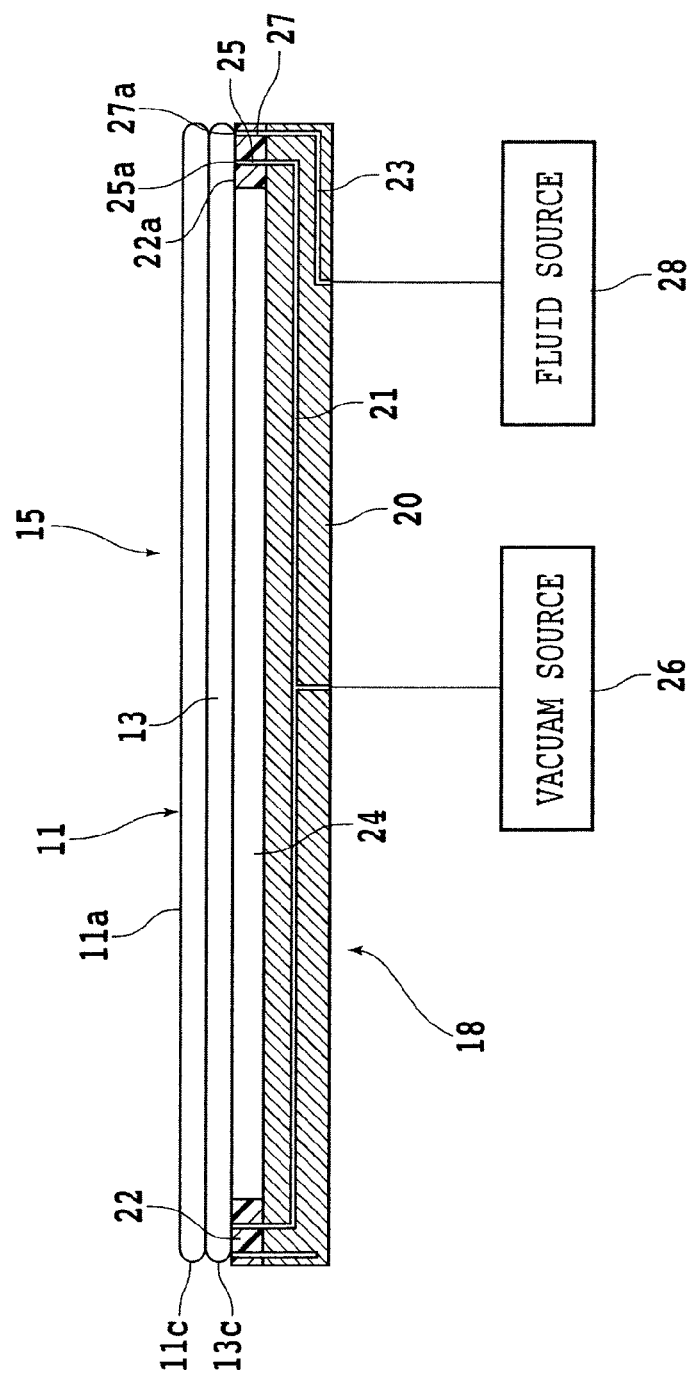
FIG. 3 is a vertical sectional view of the holding table in the condition where a support plate is held under suction.

Referring to FIG. 3, there is shown a vertical sectional view of the holding table 18 in the condition where a stacked workpiece 15 is held on the holding table 18 under suction. The stacked workpiece 15 is formed by bonding a platelike workpiece 11 on a support plate 13 through an adhesive. For example, the support plate 13 is formed from a silicon wafer having no pattern, and the platelike workpiece 11 is formed from a silicon wafer having semiconductor devices on the front side 11a. An arcuate chamfered portion 11c is formed on the entire circumference of the platelike workpiece 11, and an arcuate chamfered portion 13c is also formed on the entire circumference of the support plate 13. The support plate 13 may be formed of glass.

Referring to FIG. 4, there is shown a partially sectional side view in the condition where trimming is being performed on the chamfered portion 11c of the platelike workpiece 11 held under suction on the holding table 18 through the support plate 13. Trimming of the chamfered portion 11c is performed by feeding the cutting blade 38 being rotated at a high speed in the direction shown by an arrow A so as to cut the outer circumferential portion of the platelike workpiece 11 having the chamfered portion 11c at a predetermined depth and then rotating the holding table 18 at a low speed in the direction shown by an arrow B, thereby removing the chamfered portion 11c formed on the entire circumference of the platelike workpiece 11. Preferably, a fluid 29 such as pure water is discharged from the discharge opening 27a of the annular holding member 22 of the holding table 18 in performing this trimming. Although a cutting waste is generated during this trimming, this cutting waste is washed away by the fluid 29 discharged from the discharge opening 27a, thereby suppressing the adhesion of the cutting waste to the stacked workpiece 15 and the holding table 18.

While FIG. 4 shows the condition where the outer circumferential portion of the platelike workpiece 11 constituting the stacked workpiece 15 is being trimmed, the cutting operation for the platelike workpiece 11 held on the holding table 18 is not limited to trimming, but the holding table 18 is also applicable to cutting of the platelike workpiece 11 along division lines. Further, the holding table 18 may be used as a holding table in a laser processing apparatus in performing laser processing of the platelike workpiece 11.

In the holding table 18 according to this preferred embodiment, only the outer circumferential portion of the support plate 13 is held under suction on the annular holding member 22. Accordingly, it is possible to reduce the possibility of flawing of the support plate 13 or adhesion of contaminants to the support plate 13, so that contamination of the transporting unit or the cassette can be prevented and the support plate 13 can be reused. Further, the holding table 18 according to this preferred embodiment is applicable not only to the case of holding the support plate 13 under suction, but also to the case of directly holding the platelike workpiece 11.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A holding table for holding a platelike workpiece, comprising:
    a base; and
    an annular holding member attached to the base, the annular holding member having an annular holding surface for holding an outer circumferential portion of the platelike workpiece thereon, whereby a central recess is defined by the base and the annular holding member so as to be surrounded by the annular holding member;
    the annular holding member being formed with a suction opening exposed to the annular holding surface, a vacuum line having one end communicating with the suction opening and the other end connected to a vacuum source, a discharge opening exposed to the annular holding surface at a position radially outside of the suction opening, and a fluid line having one end communicating with the discharge opening and the other end connected to a fluid source,
    wherein the annular holding member is formed of resin.

2. The holding table according to claim 1, wherein the resin of the annular holding member is a conductive resin.

* * * * *